United States Patent [19]

Kashida et al.

[11] Patent Number: 5,089,085
[45] Date of Patent: Feb. 18, 1992

[54] SILICON CARBIDE MEMBRANE FOR X-RAY LITHOGRAPHY AND METHOD FOR THE PREPARTION THEREOF

[75] Inventors: Meguru Kashida; Yoshihiro Kubota; Yoshihiko Nagata, all of Gunma, Japan

[73] Assignee: Shin-Etsu Chemical Co., Ltd., Tokyo, Japan

[21] Appl. No.: 633,047

[22] Filed: Dec. 21, 1990

[30] Foreign Application Priority Data

Dec. 26, 1989 [JP] Japan .................................. 1-339092

[51] Int. Cl.$^5$ ...................... B44C 1/22; H01L 21/306; C03C 15/00; C03C 25/06
[52] U.S. Cl. .................................. 156/659.1; 156/644; 156/657; 156/662; 204/192.1; 378/35
[58] Field of Search ..................... 156/644, 657, 659.1, 156/662; 430/5; 378/34, 35; 204/192.1, 192.11, 192.12, 192.16, 192.25, 192.3

[56] References Cited

U.S. PATENT DOCUMENTS 4,994,141 2/1991 Harms et al. .................. 156/657 X

*Primary Examiner*—William A. Powell
*Attorney, Agent, or Firm*—McAulay Fisher Nissen Goldberg & Kiel

[57] ABSTRACT

The inventive method provides a silicon carbide membrane for X-ray lithography having high performance in respect of stability against high energy beam irradiation. The method comprises depositing a silicon carbide film by sputtering on a silicon wafer as the substrate under such conditions that the thus deposited film is under a tensile stress in a specified range by keeping the substrate at a temperature higher than 500° C. The thus deposited silicon carbide film is at least partly crystalline and the crystallinity thereof can be defined by the sharpness of a peak in the X-ray diffraction diagram of the membrane which can be assigned to the (1 1 1) plane of the crystalline silicon carbide.

6 Claims, 2 Drawing Sheets

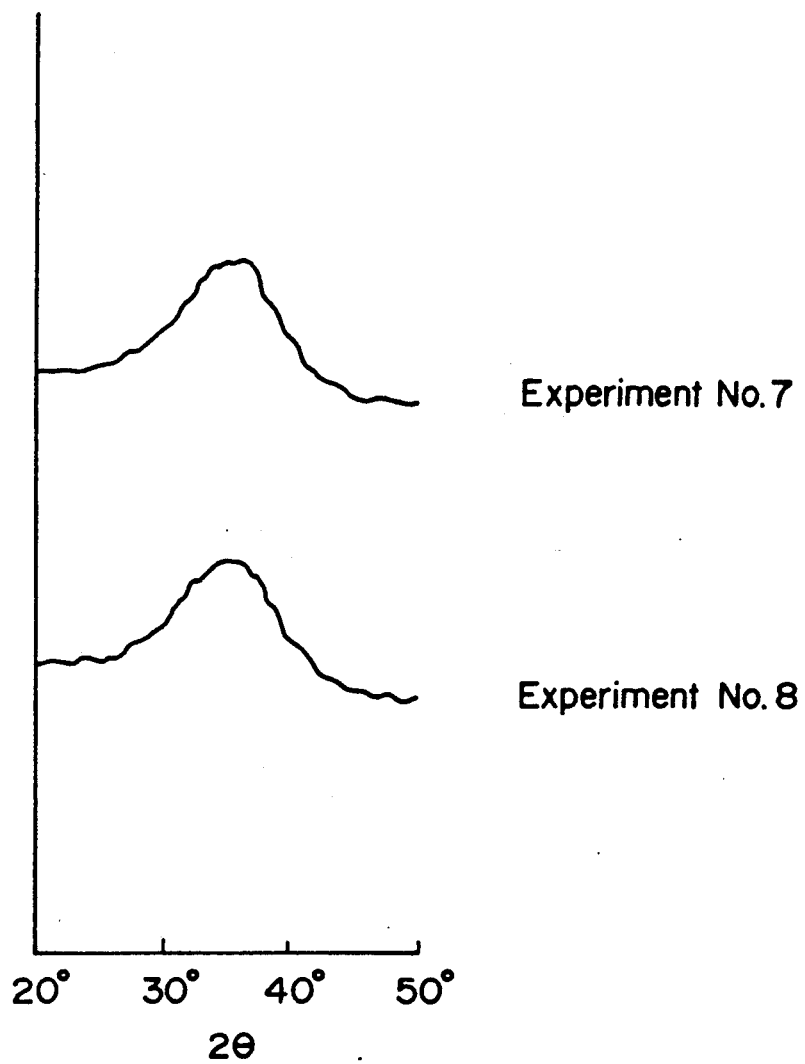

SILICON CARBIDE MEMBRANE FOR X-RAY LITHOGRAPHY AND METHOD FOR THE PREPARTION THEREOF

BACKGROUND OF THE INVENTION

The present invention relates to a membrane of silicon carbide used for X-ray lithography and a method for the preparation thereof. More particularly, the invention relates to a method for the preparation of a silicon carbide membrane used for X-ray lithography having an outstandingly high stability against irradiation with high-energy beams such as high-energy electron beams and synchrotron radiations.

Along with the trend in recent years toward finer and finer patterning in the manufacture of semiconductor devices, the technology of X-ray lithography is very promising and highlighted as a patterning process in the near future in place of the conventional photolithography. Similarly to the photomasks used in the photolithography, an X-ray transmitting membrane, referred to as an X-ray membrane hereinafter, is used as a mask in the X-ray lithography to serve as a substrate for the X-ray-absorbing patterning materials. An X-ray membrane must satisfy several requirements in order that the X-ray lithography by using the same can be performed successfully including, for example, that the membrane has a smooth surface without defects or pinholes and has a high mechanical strengths suitable for practical use in an industrial manufacturing process, that the membrane has a high light transmission which is essential in order to facilitate alignment of the mask with high precision, that the membrane has high resistance against the attack of various chemicals and moisture or water not to be damaged in the steps of etching and washing, that the membrane can withstand irradiation with high-energy beams such as high-energy electron beams and synchrotron radiations not to cause significant changes in the performance, and so on.

Various materials have been proposed for the X-ray membranes to comply with the above mentioned requirements including boron-doped silicon Si, silicon nitride $Si_3N_4$, silicon carbide SiC and the like, of which silicon carbide is accepted as the most promising material in respect of the high Young's modulus to withstand irradiation with high-energy beams.

X-ray membranes of silicon carbide or silicon nitride are prepared by utilizing the process of chemical vapor deposition (CVD) of the material on a substrate such as silicon followed by removal of the substrate material. A problem in the CVD method is that, since the film-forming material to be deposited on the substrate surface is formed by the chemical decomposition of the gaseous starting material or materials, undesirable extraneous species formed by the decomposition are unavoidably taken into the deposition of the film on the substrate surface to act as impurities in the membrane which cause several disadvantages. For example, the impurities may be readily dissipated by the irradiation with high-energy beams so as to cause occurrence of strain, changes in the stress, decrease in the mechanical strengths, decrease in the optical transparency and so on in the membrane. Further, it is of course that such impurities may result in the occurrence of pinholes and nodules on the surface of the membrane greatly affecting the quality of the membrane.

Alternatively, membranes of silicon carbide or silicon nitride can be prepared also by utilizing the method of sputtering disclosed, for example, in Japanese Patent Kokai 63-315768. Despite the advantages of the sputtering method that the content of impurities is relatively low in the membrane and the membrane is free from pinholes and nodules, the method is not free from the problems that the membrane of silicon carbide or silicon nitride is subject to the appearance of strain or distortion under irradiation with high-energy beams in a large dose as a consequence of the high amorphousness of the membrane.

SUMMARY OF THE INVENTION

The present invention accordingly has an object to provide a novel method for the preparation of a silicon carbide-based membrane for X-ray lithography having excellent resistance against irradiation with high-energy beams.

Thus, the inventive method for the preparation of a silicon carbide-based membrane for X-ray lithography comprises the steps of:

(a) depositing silicon carbide by the sputtering method employing a target of silicon carbide on a substrate of silicon kept at a temperature higher than 500° C. to form a film of silicon carbide supported on the surface of the substrate; and (b) removing the substrate partly from the film of silicon carbide leaving a portion which serves as a frame of the unsupported silicon carbide membrane.

The silicon carbide membrane prepared in the above described method characteristically contains a crystalline phase of silicon carbide and has an internal tensile stress in the range from $0.1 \times 10^9$ to $8.0 \times 10^9$ dyne/cm$^2$. Further, the crystallinity of the membrane can be characterized by the ratio $L_1:L_2$ of at least 1.5, in which $L_1$ and $L_2$ are each the height of the peak at $2\theta = 35.5°$ and $2\theta = 33.0°$, respectively, from the base line, $\theta$ being the diffraction angle in the X-ray diffraction diagram of the membrane using the CuK$\alpha$ line as the X-rays and the base line being defined as the line connecting the two points at $2\theta = 30°$ and at $2\theta = 40°$ on the X-ray diffraction diagram.

BRIEF DESCRIPTION OF THE DRAWING

FIG. 2 is a part of the X-ray diffraction diagrams of the silicon carbide membranes prepared in Experiments No. 7 and No. 8.

DETAILED DESCRIPTION OF THE PREFERRED EMBODIMENTS

Figure 1:
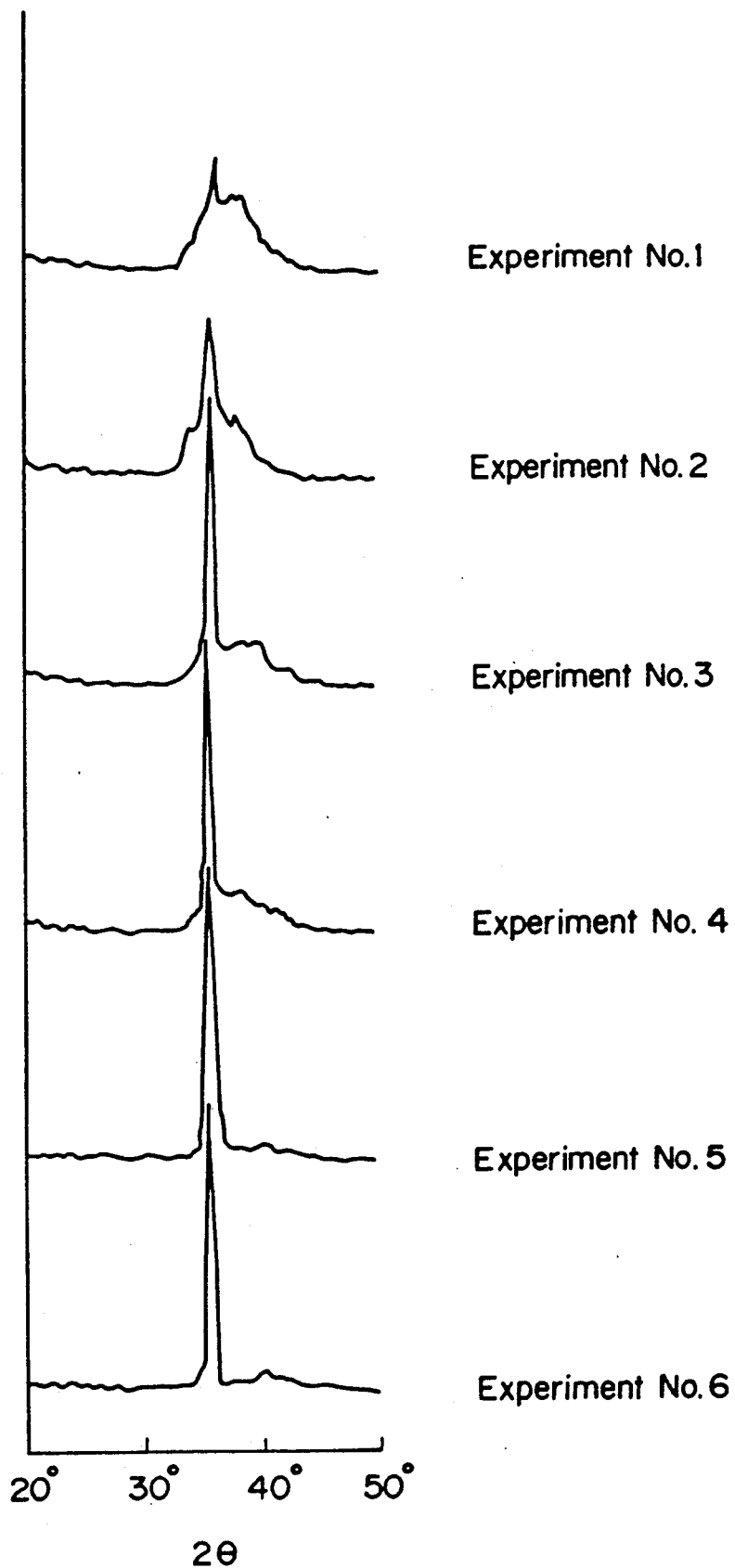
FIG. 1 is a part of the X-ray diffraction diagrams of the silicon carbide membranes prepared in Experiments No. 1 to No. 6.

As is understood from the above given description, the characteristic features of the inventive method consist in the specific conditions in the sputtering so as to impart the deposited silicon carbide film with a tensile stress in a specified range in step (a) so as to enable successful membrane preparation in step (b).

It is essential that the silicon carbide film formed in step (a) of the inventive method by sputtering deposition on the surface of the substrate such as a silicon wafer must have an internal tensile stress in the range from $0.1 \times 10^9$ to $8.0 \times 10^9$ dyne/cm$^2$. When the tensile stress is too small, difficulties are encountered in the preparation of the silicon carbide membrane in step (b) or, if it could ever be formed, the membrane may be sometimes subject to occurrence of wrinkles not to be suitable as an X-ray membrane. When the tensile stress is too large, on the other hand, rupture is sometimes caused in the membrane prepared in step (b). Preferably, the internal tensile stress of the sputtering-deposited silicon carbide film on the substrate surface is in the range from $0.3 \times 10^9$ to $4.0 \times 10^9$ dyne/cm$^2$.

Another requirement for the silicon carbide membrane prepared by the inventive method is that the silicon carbide is at least partly crystalline. When the silicon carbide membrane is amorphous as is the case in the silicon carbide membranes prepared by a conventional sputtering method, the membrane is subject to the changes in the internal stress caused by the irradiation with high energy beams. This is presumably due to the localized temperature increase in the membrane under irradiation with high energy beams to cause an increase in the crystallinity of the silicon carbide membrane consequently with a strain. In the invention, the silicon carbide membrane as prepared is already at least partly crystalline so that the membrane is little subject to the changes in the internal stress and occurrence of strain even under irradiation with high energy beams.

As a measure of the above mentioned crystallinity of the silicon carbide membrane, the sharpness of a peak in the X-ray diffraction diagram of the membrane can be used. In this case, the characteristic peak suitable for the purpose is found at $2\theta = 35.5°$ taking $\theta$ as the diffraction angle in the X-ray diffraction diagram of the membrane using the CuK$\alpha$ line as the X-rays. This peak corresponds to the crystallographic plane (1 1 1) of silicon carbide. In order to ensure full stability of the silicon carbide membrane against irradiation with high energy beams, it was found that the ratio $L_1:L_2$ should be at least 1.5 or, preferably, at least 3.0, in which $L_1$ and $L_2$ are each the height of the peak at $2\theta = 35.5°$ and $2\theta = 33.0°$, respectively, from the base line which is defined as the line connecting the two points at $2\theta = 30°$ and at $2\theta = 40°$ on the X-ray diffraction diagram. When the value of $L_1:L_2$ is too small, the membrane may be insufficiently stable against irradiation with high energy beams to cause a change in the internal stress by irradiation so that the membrane is practically not suitable as an X-ray membrane.

The silicon carbide membrane satisfying the above described requirements can be prepared according to the inventive method by the process of sputtering. Although the sputtering method is not particularly limitative, the so-called high-frequency magnetron sputtering method can be applied advantageously in respect of the relatively high rate of film deposition enabling mass production. The gas filling the atmosphere of sputtering is usually a rare gas including argon and xenon which can be admixed, if necessary, with another inert gas such as helium, nitrogen and the like. The substrate, on which the silicon carbide film is deposited by sputtering, is usually a silicon wafer. The target used for the sputtering is a sintered body of a silicon carbide powder which should have a purity of at least 99% or, desirably, at least 99.9% in order that the silicon carbide membrane formed by sputtering is free from undesirable impurities as completely as possible. The electric power supplied to the electrodes of the sputtering chamber is desirably at least 5 watts per cm$^2$ of the surface area of the target. It is essential in the inventive method that the substrate, e.g., silicon wafer, during the sputtering process is kept at a temperature higher than 500° C. or, preferably, higher than 700° C. When the temperature of the substrate is too low, the silicon carbide membrane formed by sputtering would be subject to the changes in the internal stress by the irradiation with high energy beams. The pressure inside the sputtering chamber is of some significance to influence the internal stress of the silicon carbide film deposited on the substrate surface, which should be in the range from $0.1 \times 10^9$ to $8.0 \times 10^9$ dyne/cm$^2$. Suitable pressure depends on the temperature of the substrate but it is usually in the range from 0.03 to 0.07 Torr. The uniformity in the internal stress of the silicon carbide film deposited on the substrate can be improved by an annealing treatment at a temperature higher than the temperature at which the film is deposited.

In step (b) of the inventive method, the silicon wafer on which the silicon carbide film has been deposited by sputtering in step (a) is removed by etching partly leaving the portion to serve as a frame for the unsupported silicon carbide membrane freed from the substrate. The procedure is rather conventional and not described here in detail.

In the following, examples and comparative examples are given to illustrate the method of the invention in more detail but not to limit the scope of the invention in any way. The films deposited on the substrate surface or membranes obtained in these examples and comparative examples were evaluated for the respective properties by the procedures described below.

X-RAY DIFFRACTOMETRY OF MEMBRANE

The apparatus used was an X-ray diffractometer for thin films (Model TFD, manufactured by Rigaku Co.), in which the target material was copper and the power supply to the X-ray tube was 40 kV $\times$ 40 mA. The incident angle $\theta$ was fixed at 2°.

INTERNAL STRESS OF THE FILM ON THE SUBSTRATE SURFACE

Warping of the substrate, i.e. silicon wafer, was measured before and after deposition of the silicon carbide film and the stress was calculated from the change in the warping.

RESISTANCE AGAINST HIGH ENERGY BEAM IRRADIATION

The film on the substrate surface was irradiated with high energy electron beams having an energy of 15 eV in a dose of 1.0 kJ per cm$^2$ and the change in the stress of the membrane was determined as a measure of the resistance against irradiation.

MEMBRANE-FORMABILITY OF THE FILM ON THE SUBSTRATE SURFACE

The substate wafer, on one surface of which a silicon carbide film had been deposited by sputtering, was coated on the other surface by the CVD method with a film of amorphous boron nitride in a thickness of 1.0 $\mu$m to serve as a resist layer against etching. An annular masking frame of stainless steel was put on the resist layer in direct contact and the exposed circular area of the resist layer was removed by dry-etching with carbon tetrafluoride as the etching gas. Thereafter, the silicon wafer in the thus exposed area, i.e. the area having no resist layer, was dissolved away using a 30% aqueous solution of potassium hydroxide as the etching solution leaving the annular portion of the silicon wafer to serve as a frame for the silicon carbide membrane. The membrane prepared in this manner was microscopically examined to detect any defects or pinholes and the results were recorded as "Good" or "Poor" for the absence or presence of detectable defects and pinholes.

% TRANSMISSION OF VISIBLE LIGHT THROUGH MEMBRANE

The membrane prepared in the above described manner was subjected to the measurement of the transmission of visible light at a wavelength of 633 nm by using a multi-photospectrometer.

EXAMPLE

Eight experiments, numbered as No. 1 to No. 8, were conducted in the following manner, of which No. 1 to No. 6 were for the invention and No. 7 and No. 8 were for comparative purpose.

Thus, a silicon carbide target having a diameter of 3 inches and a thickness of 5 mm, was prepared from a silicon carbide powder having a purity of 99.9% by compression molding and sintering. The target disc was set on the cathode in the sputtering chamber of a high-frequency magnetron sputtering apparatus (Model SPF-332H, manufactured by Nichiden Anerva Co.) and sputtering was performed on a mirror-polished silicon wafer having a diameter of 3 inches and a thickness of 0.6 mm as the substrate kept at a varied temperature of 300° to 1000° C. Argon gas was continuously passed through the sputtering chamber at a constant rate of 7 ml per minute and the pressure inside the sputtering chamber was controlled at a specified pressure of 0.04 to 0.05 Torr by the balance of the constant and continuous introduction of the argon gas and evacuation by means of a precision valve. The electric power density was 10 watts per cm$^2$ of the target surface and sputtering was continued for 15 minutes so that a silicon carbide film having a thickness of 1.0 μm was deposited on the substrate surface.

The silicon carbide films deposited on the substrate surface as well as the silicon carbide membranes prepared therefrom were subjected to the evaluation tests to give the results shown in the table given below, which also shows the temperature of the substrate during the sputtering process and the pressure of the sputtering atmosphere. The samples used for the tests of membrane-formability and light transmission were before irradiation with the electron beams. The internal stress in the sputtering-deposited silicon carbide film on the substrate surface was always tensile. Absolutely no change was noted in the internal stress of the silicon carbide film on the substrate surface by the electron beam irradiation in each of Experiments No. 1 to No. 6 while the tensile stress in Experiments No. 7 and No. 8 was increased by $1.1 \times 10^9$ dyne/cm$^9$ and $9.4 \times 10^9$ dyne/cm$^2$, respectively. The membrane-formability was good in each of the Experiments No. 1 to No. 8.

FIGS. 1 and 2 of the accompanying drawing are each a part of the X-ray diffraction diagrams taken with the membranes prepared in Experiments No. 1 to No. 6 and in Experiments No. 7 and No. 8, respectively. The value of $L_1:L_2$ in each experiments shown in the table below was obtained from these figures by the procedure described before.

TABLE

| Expt. No. | 1 | 2 | 3 | 4 | 5 | 6 | 7 | 8 |
|---|---|---|---|---|---|---|---|---|
| Substrate temperature, °C. | 500 | 600 | 700 | 800 | 900 | 1000 | 300 | 400 |
| Sputtering pressure, $\times 10^{-3}$ Torr | 50 | 50 | 45 | 45 | 40 | 40 | 50 | 50 |
| Internal stress of SiC film, $\times 10^9$ dyne/cm$^2$ | 2.5 | 2.9 | 2.6 | 2.2 | 2.4 | 2.3 | 2.2 | 2.7 |
| $L_1:L_2$ ratio | >10 | >10 | >10 | >10 | >10 | >10 | 1.1 | 1.1 |
| Light transmission, %, at 633 nm | 27 | 27 | 27 | 26 | 27 | 27 | 26 | 26 |

What is claimed is:

1. A method for the preparation of a silicon carbide membrane for X-ray lithography which comprises the steps of:
   (a) depositing silicon carbide by the sputtering method employing a target of silicon carbide on a substrate of silicon kept at a temperature higher than 500° C. to form a film of silicon carbide supported on the surface of the substrate; and
   (b) removing the substrate partly from the film of silicon carbide leaving a portion which serves as a frame of the unsupported silicon carbide membrane.

2. The method for the preparation of a silicon carbide membrane for X-ray lithography as claimed in claim 1 in which the substrate in step (a) is kept at a temperature higher than 700° C.

3. The method for the preparation of a silicon carbide membrane for X-ray lithography as claimed in claim 1 in which the sputtering in step (a) is performed under a pressure in the range from $30 \times 10^{-3}$ to $70 \times 10^{-3}$ Torr.

4. A silicon carbide membrane for X-ray lithography which has an at least partial crystallinity and has an internal tensile stress in the range from $0.1 \times 10^9$ to $8.0 \times 10^9$ dyne/cm$^2$.

5. The silicon carbide membrane for X-ray lithography as claimed in claim 4 in which the at least partial crystallinity of the membrane is defined by the ratio $L_1:L_2$ of at least 1.5, $L_1$ and $L_2$ each being the height of the peak at $2\theta = 35.5°$ and $2\theta = 33.0°$, respectively, from the base line, $\theta$ being the diffraction angle in the X-ray diffraction diagram of the membrane using the CuK$\alpha$ line as the X-rays and the base line being defined as the line connecting the two points at $2\theta = 30°$ and at $2\theta = 40°$ on the X-ray diffraction diagram.

6. The silicon carbide membrane for X-ray lithography as claimed in claim 5 in which the value of the ratio $L_1:L_2$ is at least 3.0.

* * * * *